United States Patent
Gao

(10) Patent No.: US 11,547,022 B2
(45) Date of Patent: Jan. 3, 2023

(54) THERMAL MANAGEMENT PLATE FOR CRITICAL PROCESSORS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 57 days.

(21) Appl. No.: 17/319,531

(22) Filed: May 13, 2021

(65) Prior Publication Data

US 2022/0369517 A1 Nov. 17, 2022

(51) Int. Cl.
*H05K 7/20* (2006.01)

(52) U.S. Cl.
CPC ....... *H05K 7/20772* (2013.01); *H05K 7/2029* (2013.01); *H05K 7/20254* (2013.01); *H05K 7/20263* (2013.01); *H05K 7/20272* (2013.01); *H05K 7/20809* (2013.01); *H05K 7/20309* (2013.01)

(58) Field of Classification Search
CPC ........... H05K 7/20772; H05K 7/20254; H05K 7/20263; H05K 7/20272; H05K 7/2029; H05K 7/20809; H05K 7/20309; H01L 23/473; H01L 23/427; G06F 1/20
See application file for complete search history.

(56) References Cited

U.S. PATENT DOCUMENTS

| | | | | |
|---|---|---|---|---|
| 3,512,582 A | * | 5/1970 | Chu | H01L 23/427 174/15.1 |
| 6,994,151 B2 | * | 2/2006 | Zhou | H01L 23/427 174/15.1 |
| 9,357,675 B2 | * | 5/2016 | Campbell | B23P 15/26 |
| 11,201,102 B2 | * | 12/2021 | Parida | F28D 15/046 |
| 11,406,047 B2 | * | 8/2022 | Chehade | F28D 20/021 |
| 2020/0315069 A1 | * | 10/2020 | Chiu | H05K 7/20772 |
| 2022/0065549 A1 | * | 3/2022 | Zhou | F28D 15/046 |

* cited by examiner

*Primary Examiner* — Zachary Pape
(74) *Attorney, Agent, or Firm* — Womble Bond Dickinson (US) LLP

(57) ABSTRACT

A cooling plate module includes a first cooling plate layer having a single phase area within and a second cooling plate layer having a phase change area within. The first cooling plate layer includes a first liquid inlet port to receive a first cooling liquid into the single phase area and a first liquid outlet port to expel the first cooling liquid from the single phase area. The second cooling plate layer includes a second liquid inlet port to receive a second cooling liquid into the phase change and a vapor outlet port to expel the second cooling liquid in a vapor state from the phase change area, where the first cooling plate layer is in thermal contact with the second cooling plate layer, and the first cooling plate layer is in thermal contact with IT components to be cooled.

20 Claims, 7 Drawing Sheets

THERMAL MANAGEMENT PLATE FOR CRITICAL PROCESSORS

FIELD OF THE INVENTION

Embodiments of the present invention relate generally to server and data center cooling. More particularly, embodiments of the invention relate to a thermal management plate for critical processors.

BACKGROUND

Modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Modern IT equipment therefore requires liquid cooling or liquid-air hybrid cooling Cold/cooling plates are an element used in many liquid cooling solutions. Cold plates are elements that are coupled to heat-generating components, such as critical processors. Once a cold plate is coupled to a heat-generating component, liquid circulates through the cold plate to remove the heat. Existing solutions for electronics cooling and thermal management for processor does not provide redundancy on a cold plate module level, which means there is a single failure point at the cold plate module level.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
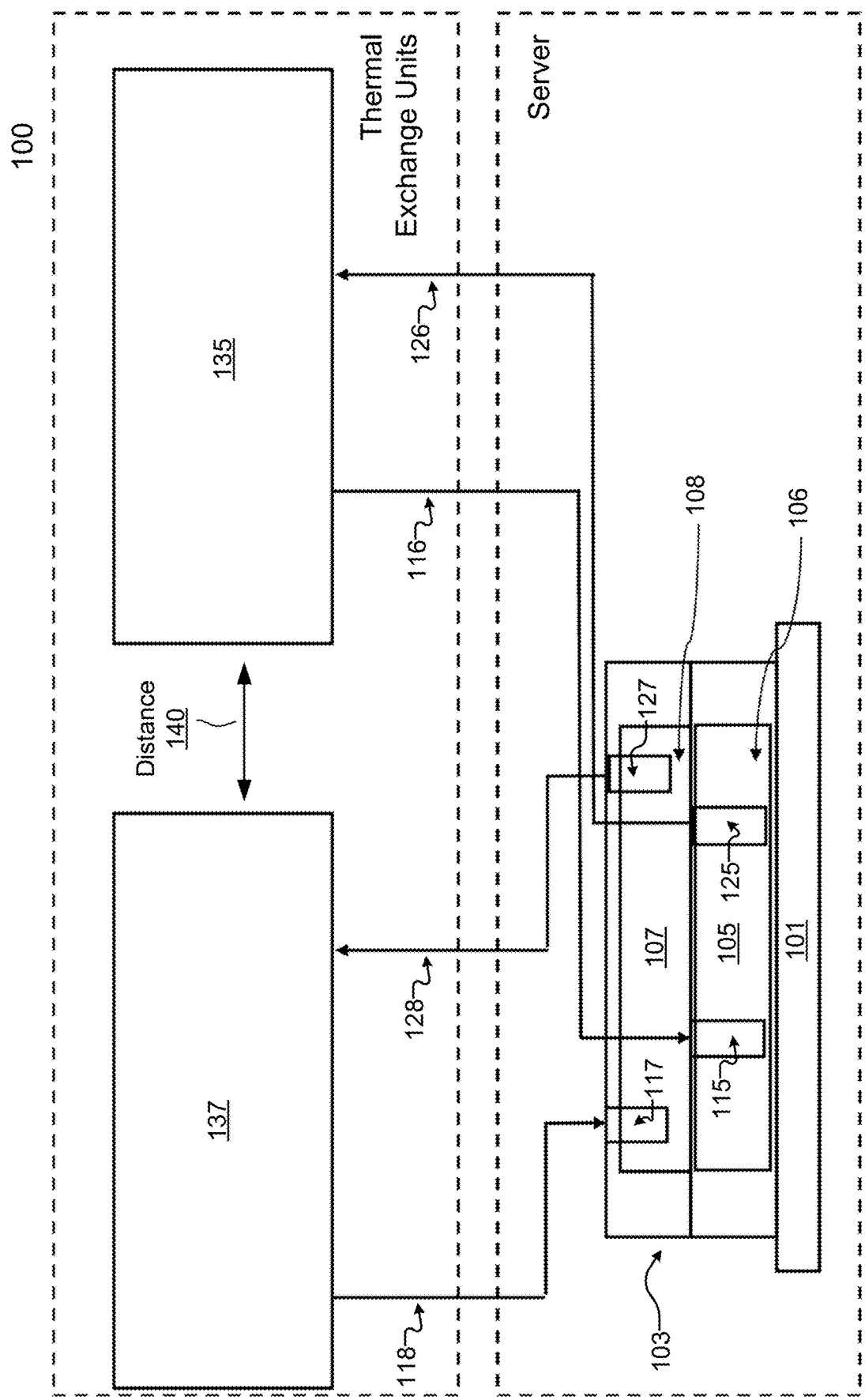
FIG. 1 is a block diagram of a thermal management system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspect of the present disclosure are directed to a thermal management plate module that can operate to circulate cooling medium in a single phase mode, a phase change mode, or a hybrid mode. A single phase plate layer is designed on the bottom and it is directly assembled onto processing units to be cooled. A phase change or a two phase plate layer is designed on the top of the single phase plate layer. In one embodiment, an intermediate plate is designed with microchannel structures on opposing side, and the intermediate plate acts as an integrated unit for the single phase plate layer and the phase change plate layer. The single phase layer can be used for normal thermal management operations. The phase change layer is self-sensing and self-regulating and can be activated when an interface temperature between the single phase layer and the phase change layer is higher than a boiling point temperature of circulating liquid.

According to a first aspect, a cooling plate module includes a first cooling plate layer having a single phase area within and a second cooling plate layer having a phase change area within. The first cooling plate layer includes a first liquid inlet port coupled to the first cooling plate layer to receive a first cooling liquid into the single phase area and a first liquid outlet port coupled to the first cooling plate layer to expel the first cooling liquid from the single phase area. The second cooling plate layer includes a second liquid inlet port coupled to the second cooling plate layer to receive a second cooling liquid into the phase change and a vapor outlet port coupled to the second cooling plate layer to expel the second cooling liquid in a vapor state from the phase change area. A first portion of the first cooling plate layer is in thermal contact with a portion of the second cooling plate layer, and a second portion of the first cooling plate layer is in thermal contact with IT components to be cooled.

In one embodiment, the first cooling plate layer further includes a first number of liquid cooling fins to form a first liquid channel in the single phase area. In one embodiment, the second cooling plate layer further includes a second number of liquid cooling fins to form a first liquid channel in the phase change area.

In one embodiment, each of the first liquid cooling fins are spaced apart by a first spacing and each of the second liquid cooling fins are spaced apart by a second spacing. In one embodiment, the first liquid cooling fins is parallel to, and are staggered from, the second liquid cooling fins forming staggered liquid channels.

In one embodiment, the first liquid cooling fins are perpendicular to the second liquid cooling fins forming perpendicular liquid channels. In one embodiment, the first cooling plate is coupled to a liquid manifold and the liquid manifold actively facilitates liquid flow in the single phase area.

In one embodiment, a flow in the phase change area is facilitated by gravity as liquid flowing in the phase change area undergoes a phase change to a vapor state when a temperature of the second cooling plate layer is above a predetermined temperature, where vapor exits from the vapor outlet port and liquid enters the second inlet port of the phase change area by gravity. In one embodiment, a flow in the phase change area is facilitated by pressure as liquid flowing in the phase change area undergoes a phase change to a vapor state and a change in density in the phase change area causes vapor to expel from the vapor outlet port, wherein the expelled vapor causes liquid at a liquid supply reservoir to enter the second inlet port of the phase change area.

In one embodiment, the first cooling plate layer and the second cooling plate layer are independently machined with the single phase area separated from the phase change area. In one embodiment, the first cooling plate layer and the second cooling plate layer, together, is an integrated cooling plate which is machined as a single unit, wherein the integrated cooling plate includes a first number of liquid cooling fins on a first surface of the integrated cooling plate, wherein the integrated cooling plate includes a second number of liquid cooling fins on an opposing surface of the integrated cooling plate. In one embodiment, the integrated cooling plate further includes a top frame covering the first liquid cooling fins, and a bottom frame covering the second liquid cooling fins, where the bottom frame is thermally coupled to the IT components to be cooled.

According to a second aspect, a cooling system includes a first liquid supply and a liquid return, a second liquid supply and a vapor return, and at least one cooling plate module. The at least one cooling plate module is coupled to the first liquid supply and the liquid return, and the second liquid supply and the vapor return. The at least one cooling plate module includes a first cooling plate layer having a single phase area within and a second cooling plate layer having a phase change area within. The first cooling plate layer includes a first liquid inlet port coupled to the first cooling plate layer to receive a first cooling liquid into the single phase area and a first liquid outlet port coupled to the first cooling plate layer to expel the first cooling liquid from the single phase area. The second cooling plate layer includes a second liquid inlet port coupled to the second cooling plate layer to receive a second cooling liquid into the phase change and a vapor outlet port coupled to the second cooling plate layer to expel the second cooling liquid in a vapor state from the phase change area. A first portion of the first cooling plate layer is in thermal contact with a portion of the second cooling plate layer, and a second portion of the first cooling plate layer is in thermal contact with IT components to be cooled.

According to a third aspect, a cooling plate module includes an intermediate cooling plate. The cooling plate module includes a bottom frame secured to a bottom surface of the intermediate cooling plate having a single phase area in between the intermediate cooling plate and the bottom frame. The cooling plate module includes a top frame secured to a top surface of the intermediate cooling plate having a phase change area in between the intermediate cooling plate and the top frame. The cooling plate module includes a first liquid inlet port and a first liquid outlet port coupled to the intermediate cooling plate to form a first liquid channel in the single phase area. The cooling plate module includes a second liquid inlet port and a vapor outlet port coupled to the intermediate cooling plate to form a second liquid channel in the phase change area, where a portion of the bottom frame is in thermal contact with IT components to be cooled.

FIG. 1 is a side view of a thermal management system 100 according to one embodiment. Thermal management system 100 may include one or more processing units 101 (e.g., central processors or CPUs, graphical processors (GPU), tensor processors (TPU), or any type of processors or application-specific integrated circuits (ASIC)). Processing units 101 may perform data processing tasks by executing executable instructions that are stored in a storage device (not shown), loaded into the memory (not shown), to perform the data processing tasks.

Processing units 101 may be part of a host server or a compute server (such as CPU server or GPU server). A host server typically interfaces with clients over a network (e.g., Internet) to receive a request for a particular service such as storage services (e.g., cloud-based storage services such as backup and/or restoration), or services to execute an application to perform certain operations (e.g., image processing, deep data learning algorithms or modeling, etc., as a part of a software-as-a-service or SaaS platform). In response to the request, the host server distributes the tasks to compute server(s) (having one or more GPUs) managed by the host server. The host server or compute servers perform particular tasks, which generates heat during these operations.

As shown in FIG. 1, in one embodiment, cooling plate module (or plate module) 103 has a double plate layer implementation, where plate module 103 includes thermal management plate layer 105 (or simply cooling plate 105) and thermal management plate layer 107 (or simply cooling plate 107). Cooling plate 105 can include a single phase area 106 (e.g., a volume or pocket of space within cooling plate 106 as fluid region) and cooling plate 107 can include a phase change area 108 (e.g., a volume or pocket of space within cooling plate 107 to store liquid/vapor). A bottom surface of cooling plate 105 of plate module 103 is attached directly onto a surface of processor units 101 to extract the heat generated by the processing units 101.

In one embodiment, cooling plate 105 includes inlet port 115 and outlet port 125. Inlet port 115 and outlet port 125 are used to exchange liquid (e.g., receive and expel) in single phase area 106, where inlet port 115 and outlet port 125 are connected to liquid supply line 116 and liquid return line 126, respectively. In one embodiment, cooling plate 107 includes inlet port 117 and outlet port 127. Inlet port 117 and outlet port 127 are used to exchange liquid/vapor (e.g., receive and expel) in phase change area 108, where inlet port 117 and outlet port 127 are connected to liquid supply line 118 and vapor return line 128, respectively. Note that a two-port pair (e.g., 115, 125, and 117, 127) are used for each cooling plate 105,107, and each two-port pair can be connected to a corresponding thermal exchange unit 135-137.

In one embodiment, thermal exchange unit 135 is a facility-level single-phase (liquid) heat exchange unit with centralized pumping or a server-level single-phase heat exchange unit with localized pumping. In one embodiment, thermal exchange unit 137 is an enclosed reservoir with no active moving components. That is, thermal exchange unit 137 is designed as a self-activated loop to circulate a cooling medium, in either liquid and/or vapor states, where thermal exchange unit 137 has no active pump to supply the liquid or to receive the vapor return. The loop between 135 and 106 may include a fluid pump on either 116 or 126.

In one embodiment, thermal exchange unit 135 and thermal exchange unit 137 are spaced a predetermined distance apart 140 to ensure exchanges 135-137 are thermally decoupled.

Figure 2:
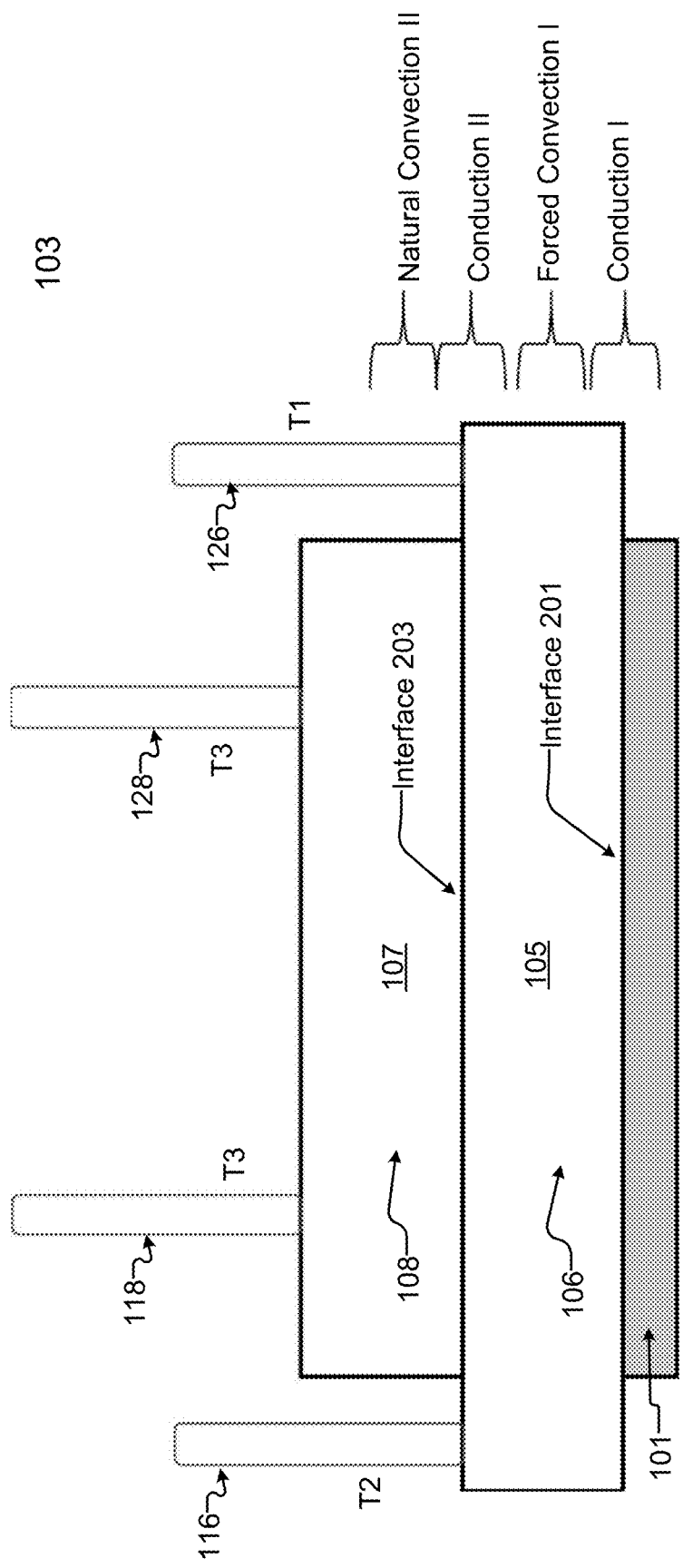
FIG. 2 is a block diagram of a thermal management plate according to one embodiment.

FIG. 2 is a block diagram of a thermal management plate module 103 according to one embodiment. Thermal management plate module 103 includes cooling plate 105 stacked on top of cooling plate 107. Processing unit 101 can represent one or more high power density processors. As described previously, cooling plate 105 is coupled to liquid supply 116 and liquid return 126. cooling plate 107 is coupled to liquid supply 118 and vapor return 128.

In one embodiment, multiple heat transfer mechanisms are involved within plate module 103. For example, a first heat transfer mechanism is conduction I, at interface 201, which conducts heat away from processing unit 101 to cooling plate 105. Within cooling plate 105, a second heat transfer mechanism is forced convection I, where liquid is forced to distribute in single phase area 106 through one or more liquid channels (shown in FIGS. 3-4). Forced convection I involves an active pump (not shown) that circulates liquid between liquid supply 116 and liquid return 126 to regulate a temperature at cooling plate 105. Here, forced convection I is the main cooling or primary cooling mechanism of plate module 103.

A third heat transfer mechanism is conduction II which conducts heat between single phase area 106 and phase change area 108, at interface 203. A fourth heat transfer mechanism is natural convection II. Natural convection II uses liquid supply 118 and vapor return 128 to circulate a cooling medium. Natural convection II is activated when a temperature at interface 203 is higher than the boiling point of the cooling medium that is circulated by cooling plate 107. Here, the cooling medium undergoes a phase change within phase change area 108, where different cooling medium can be selected for different boiling points based on a desired temperature to be maintained at interface 203. For example, a cooling medium can be water treated to certain pressure, refrigerant coolant, or any other cooling medium, to select a desired boiling point temperature. In one embodiment, the cooling medium circulated in phase change area 108 is separate from the cooling liquid circulated in single phase area 106. That is, there are two thermal loops in the cooling plate module 103, where cooling medium of the two loops are separated.

From an implementation perspective, a main function of plate module 103 is to keep temperature at interface 201 under a specified operating temperature as required by processing unit 101. During normal operation, temperature at interface 203 can be maintained under boiling point of the phase change fluid. When temperature at interface 203 is higher than the boiling point of the selected cooling medium, due to failure, lack of cooling capacity, or any other similar scenarios, cooling medium undergoes a phase change within phase change area 108. E.g., when heat is not able to be extracted or sufficiently extracted quickly enough by forced convection I, natural convection II would be triggered automatically.

In one embodiment, in a design stage, based on a desired temperature at interface 201, T1 can be selected as a supply liquid temperature for cooling plate 105, and T2 can be selected as a return liquid temperature of cooling plate 105. T3 can be a temperature at supply line 118 and vapor return line 128 for cooling medium. Here, cooling medium in phase change area 108 undergoes a phase change from liquid to vapor while extracting heat away from interface 203 even though cooling medium, the liquid and the vapor, at ports 118,128 remain relatively the same, at temperature T3.

Figure 3:
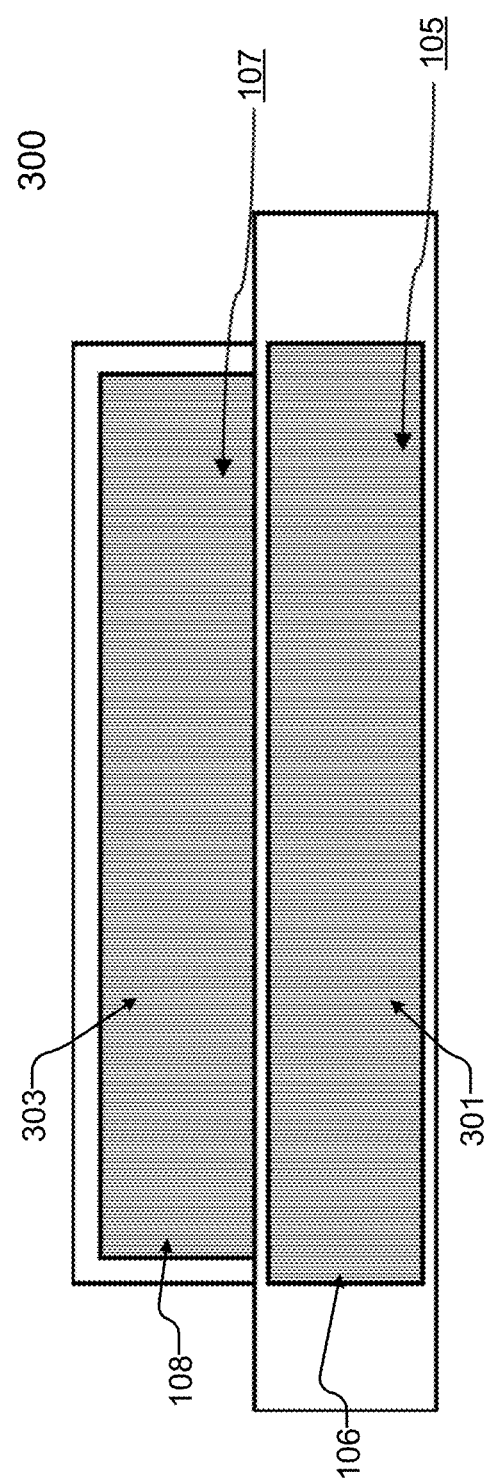
FIG. 3 is a block diagram of a thermal management plate according to one embodiment.

FIG. 3 is a block diagram of a thermal management plate module 300 according to one embodiment. Thermal management plate module 300 can represent plate module 103 of FIG. 1-2. As shown, thermal management plate module 300 includes cooling plates 105 and 107, where cooling plate 107 is stacked on top of cooling plate 105. In this design, two heat exchange areas (106 and 108) can be separately designed and machined. Once machined, cooling plate 105 can be permanently (soldered) or temporarily (thermal paste) coupled to cooling plate 107. In one embodiment, cooling plates 105 and 107 can include liquid cooling fins 301-303, as shown in FIG. 3. Liquid cooling fins 301-303 can form one or more fluid channels to facilitate convection (e.g., forced convection I or natural convection II) for cooling plates 105 and 107, respectively, to facilitate cooling medium to flow between corresponding inlet and outlet ports. In one embodiment, fins 301 are parallel and staggered from fins 303 such that fluid channels for fins 301 are staggered from fluid channels for fins 303. In one embodiment, fins 301 are perpendicular to fins 303 so the inlet/outlet ports for cooling plate 105 can be placed at different locations from cooling plate 107. In this case, the fluid channels in area 106 are perpendicular to fluid channels in area 108.

Figure 4:
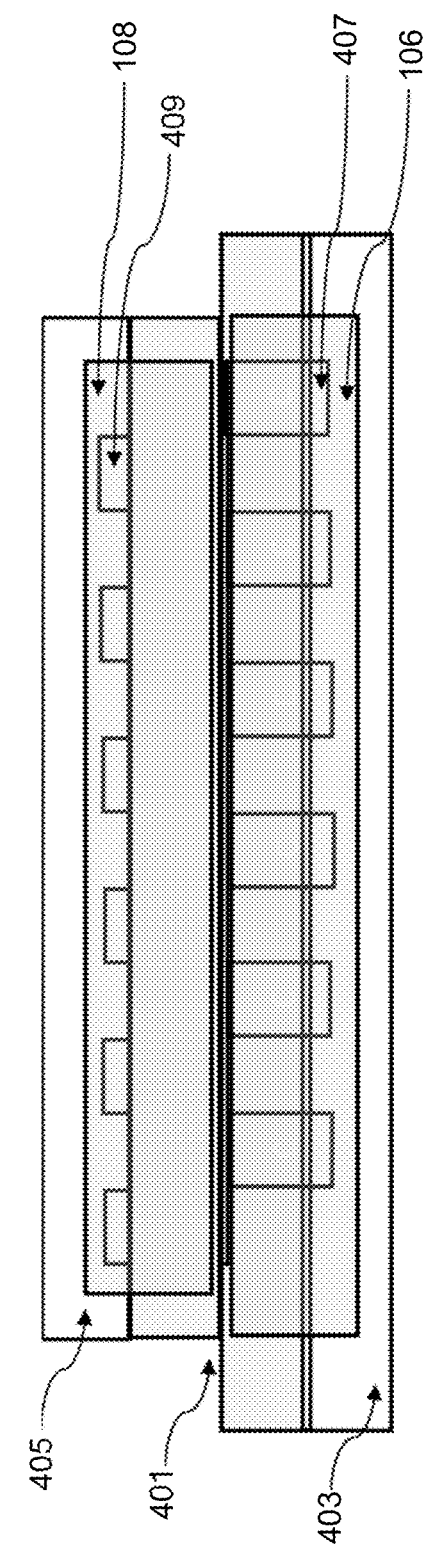
FIG. 4 is a block diagram of a thermal management plate according to one embodiment.

FIG. 4 is a block diagram of a thermal management plate module 400 according to one embodiment. Thermal management plate module 400 can represent plate module 103 of FIG. 1-2. As shown, thermal management plate includes an intermediate cooling plate 401 (or simply intermediate plate 401), bottom frame 403, and top frame 405. The bottom frame 403 and intermediate plate 401 together form single phase area 106. The top frame 405 and intermediate plate 401 together form phase change area 108. In one embodiment, intermediate plate 401 includes fins 407 near a bottom surface. In one embodiment, intermediate plate 401 includes fins 409 near a top surface. Fins 407-409 can increase the contact surface area for an improved heat dissipation and can form channels to direct cooling medium to flow from an inlet port to an outlet port. In one embodiment, intermediate plate 401 is machined as a single unit with fins 407-409. In one embodiment, fins 407 are staggered from fins 409, where both fins 407-409 are machined together with intermediate plate 401. In one embodiment, channels formed by fins 407 are separated from channels formed by fins 409. E.g., liquid flowing in single phase area 106 is different from cooling medium flowing in phase change area 108.

Figure 5:
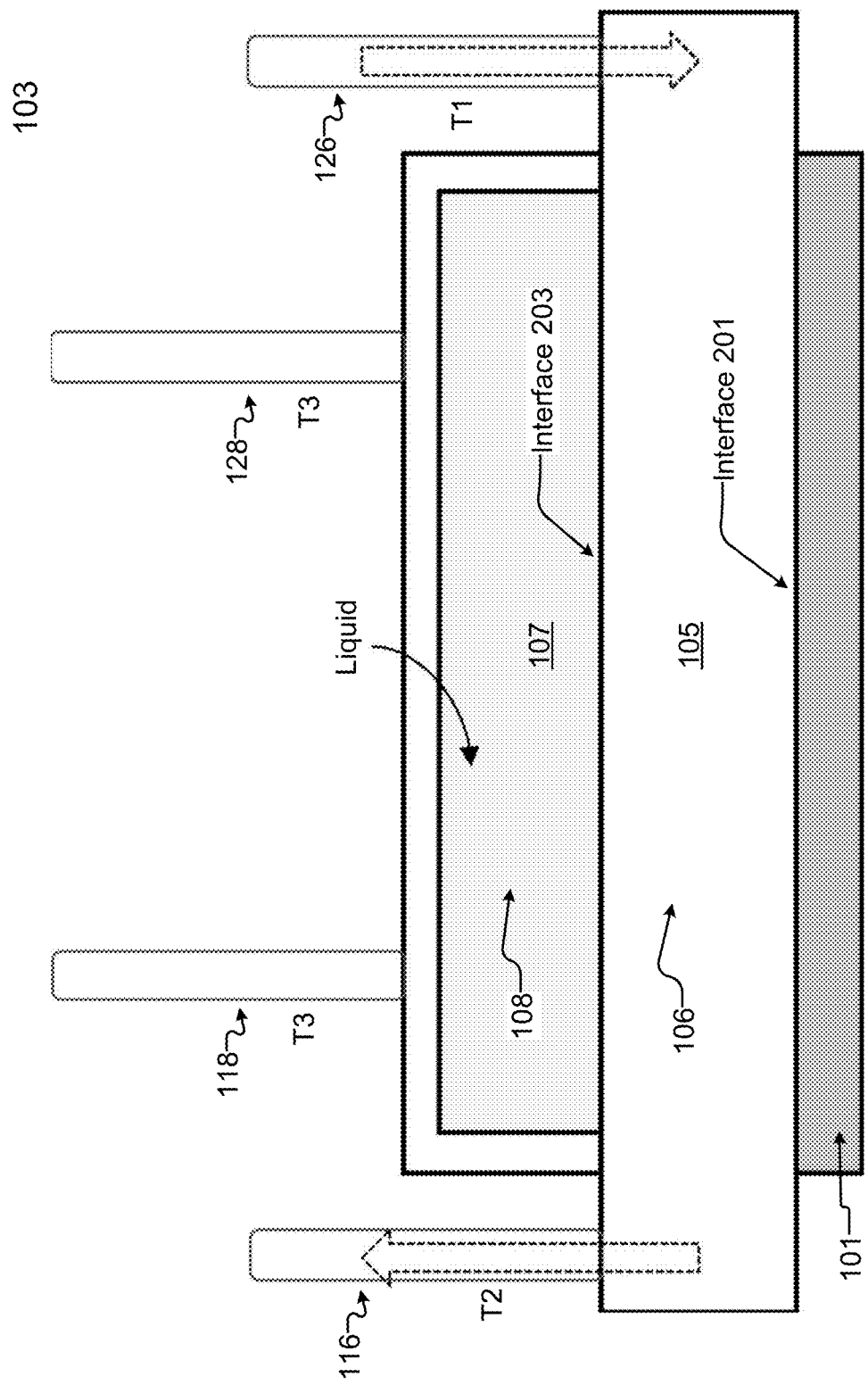
FIG. 5 is a block diagram illustrating thermal management for a single phase mode according to one embodiment.

FIG. 5 is a block diagram illustrating thermal management plate 103 operating in a single phase mode according to one embodiment. FIG. 5 illustrates a normal operation scenario where only a single phase area 106 is used for cooling. In this scenario, since heat is extracted sufficiently quickly by single phase liquid circulated in cooling plate 105, the temperature at interface 203 would be lower than a boiling point temperature of cooling medium held in phase change area 108. Here, no phase change is activated at phase change area 108 and cooling medium in phase change area 108 remains in a liquid state, e.g., no vapor is generated.

Figure 6:
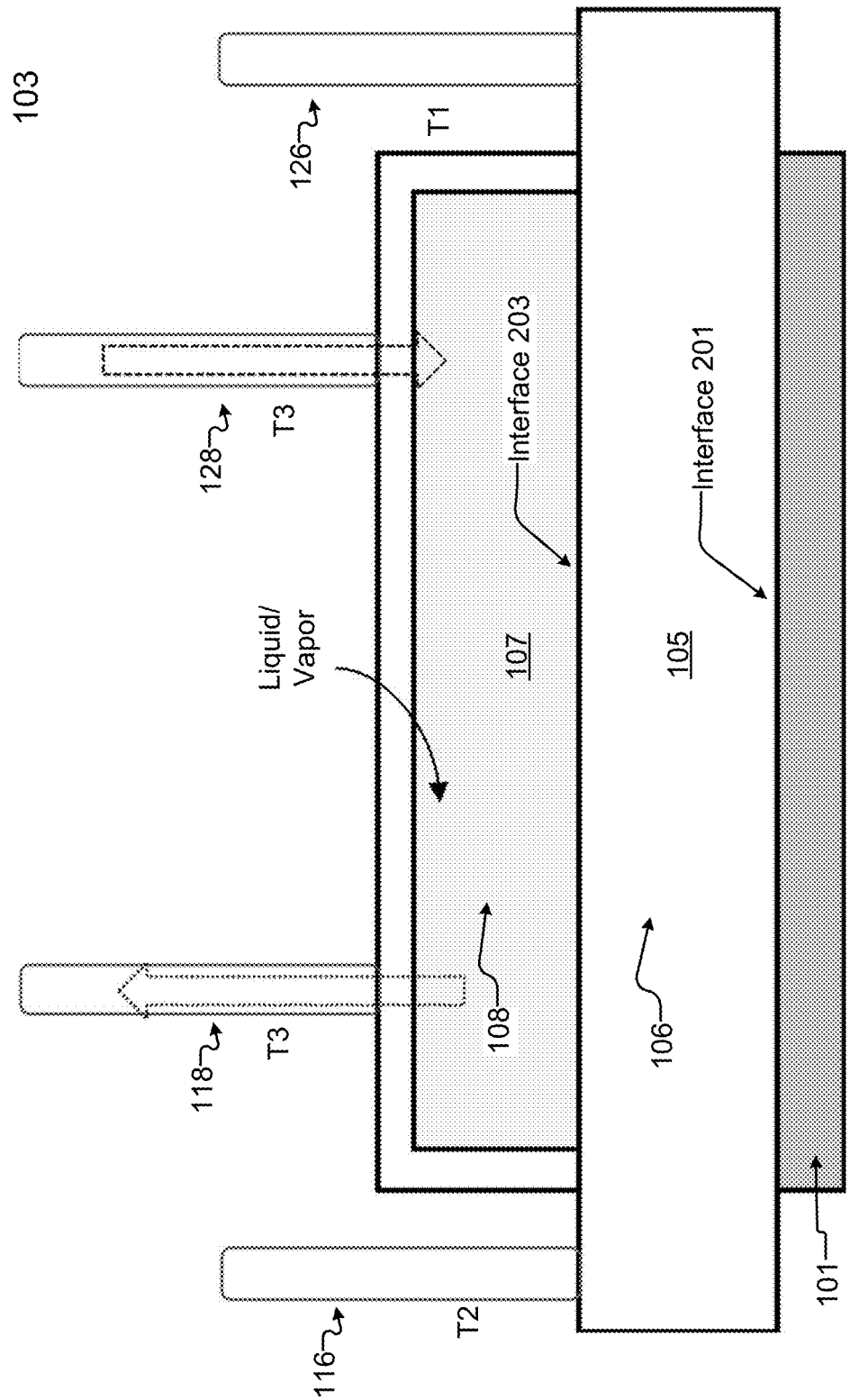
FIG. 6 is a block diagram illustrating thermal management for a phase change mode according to one embodiment.

FIG. 6 is a block diagram illustrating thermal management plate 103 operating in a phase change mode according to one embodiment. FIG. 6 illustrates a failure scenario where an external pump fails to circulate cooling liquid in single phase area 106 or corresponding ports of plate 105 are jammed. In this scenario, the temperature at interface 203 is higher than a boiling point temperature of the cooling medium circulated by phase change area 108, since heat is not extracted from cooling plate 105 quickly enough. The higher temperature at interface 203 activates the phase change area 108 automatically, e.g., causes the liquid medium in phase change area 108 to undergo a phase change from liquid to vapor state. In one scenario, the thermal management system may not support the heat removal from processing unit 101. Here plate 107 and the liquid medium supply by plate 107 need would need to be designed to be able to remove a predetermined threshold of thermal load to ensure an operator has adequate time can diagnose the failure scenario. In another scenario, when the temperature of interface 203 is above a boiling point of cooling medium in phase change area 108, the higher temperature may cause processing units 101 to throttle performance to limit its thermal output, thereby, processing unit 101 can continue to operate with limited performance.

Figure 7:
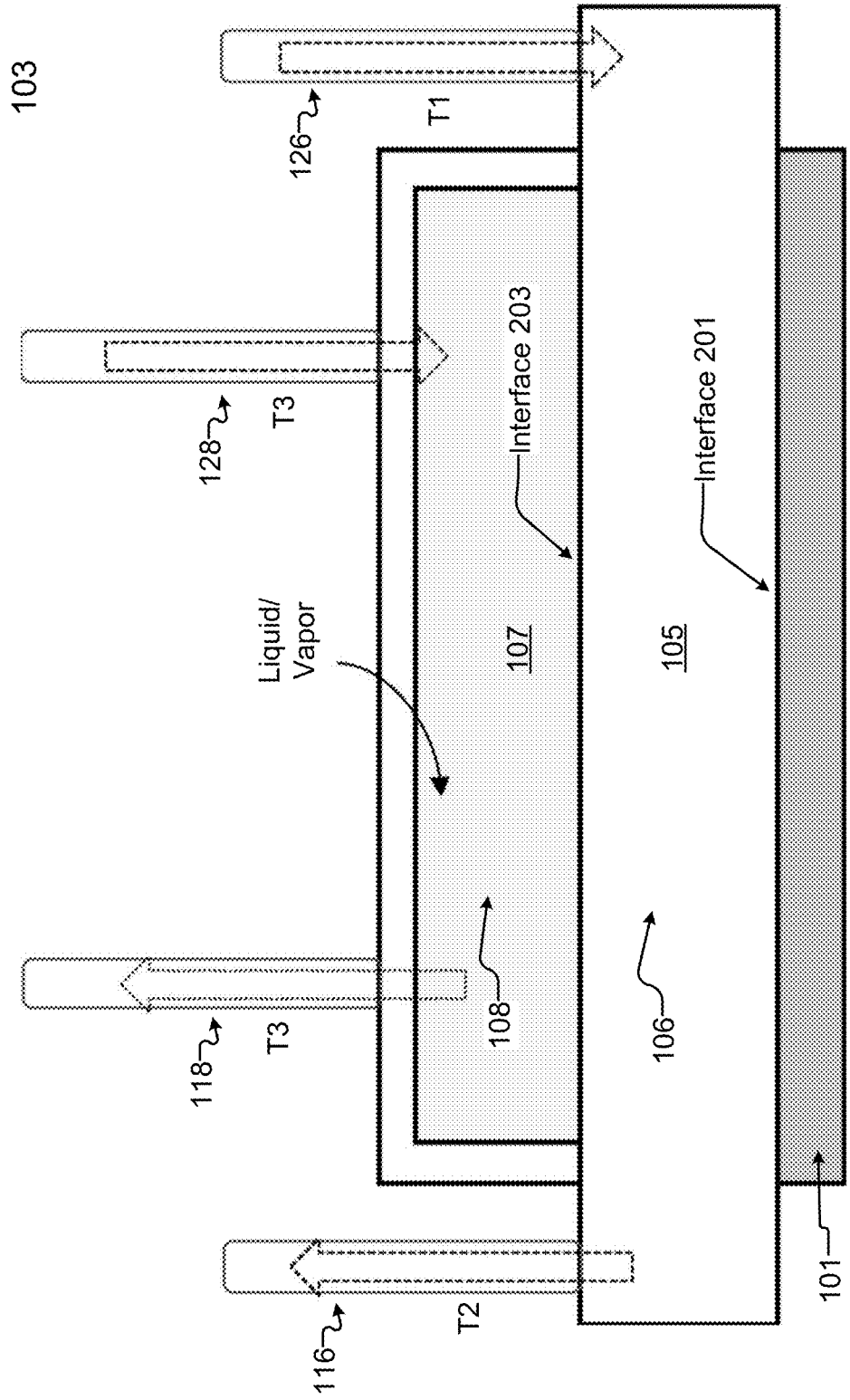
FIG. 7 is a block diagram illustrating thermal management for a hybrid mode according to one embodiment.

FIG. 7 is a block diagram illustrating thermal management for a hybrid mode according to one embodiment. FIG. 7 illustrates a normal operating scenario with a hybrid mode, where both single phase 106 and phase change area 108 are active. This scenario occurs when a cooling capacity from the single phase area 106 is less than the heat generated from processing unit 101 due to various reason. For example, when the power of processing unit 101 is much higher under high computation circumstances (e.g., video rendering, training, etc.), the temperature at interface 203 would be higher than temperature at interface 201 even though liquid is circulating in single phase area 106. Here, phase change area 108 can assist in extracting a thermal load overspill from single phase area 106. In one embodiment, a liquid medium in phase change area 108 can be selected so that a certain percentage of heat is removed by plate 105, and the rest of the heat, as designed by the cooling plate module, is removed by plate 107.

Figure 8:
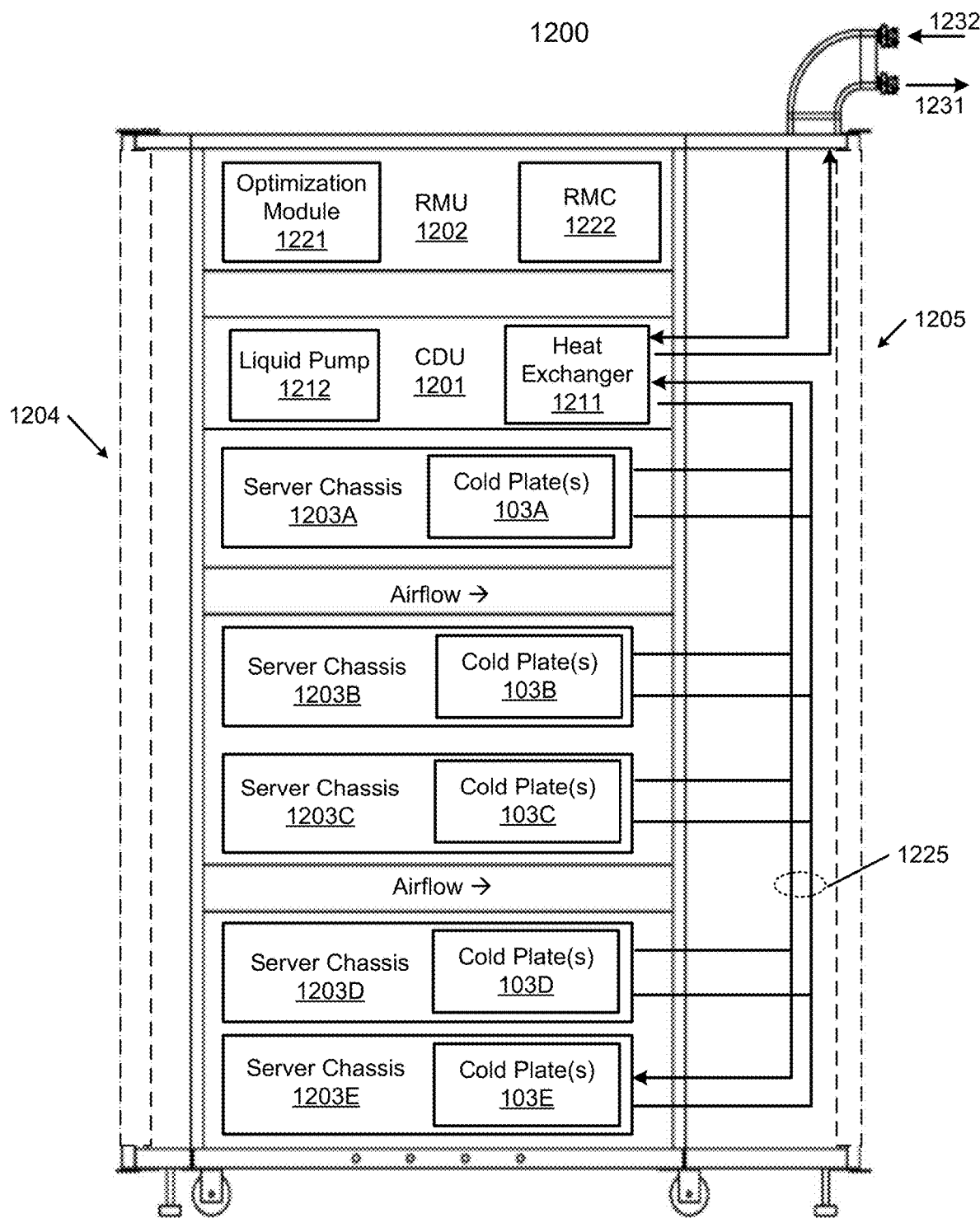
FIG. 8 is a block diagram of an embodiment of an IT container including an electronic rack with electronics and cooling systems housed within.

FIG. 8 is block diagram illustrating an electronic rack according to one embodiment. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In one embodiment, server chassis 1203A-1203E include cold/cooling plate modules 103A-103E. Each of cooling plate modules 103A-103E can include a thermal exchange unit 137 (not shown). In one embodiment, cooling plate modules 103A-103E can share a thermal exchange unit 137 (not shown). The thermal exchange unit 137 can be a passive reservoir to store a liquid/vapor medium.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and existing at backend 1205 of electronic rack 1200.

In one embodiment, CDU 1201 mainly includes heat exchange unit 1211, liquid pump 1212, and a pump controller (not shown), and some other components such as a liquid reservoir, a power supply, monitoring sensors and so on. Heat exchange unit 1211 may be a liquid-to-liquid heat exchange unit. Heat exchange unit 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchange unit 1211 further includes a second loop with two ports having a second pair of liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to CDU 1201. Note that CDUs 1201 can be any kind of CDUs commercially available or customized ones. Thus, the details of CDUs 1201 will not be described herein.

Each of server chassis 1203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 1201 may be an optional unit. The cooling plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a sever chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate module comprising:
    a first cooling plate layer having a single phase area within, wherein the first cooling plate layer comprises:
        a first liquid inlet port coupled to the first cooling plate layer to receive a first cooling liquid into the single phase area; and
        a first liquid outlet port coupled to the first cooling plate layer to expel the first cooling liquid from the single phase area; and
    a second cooling plate layer having a phase change area within, wherein the second cooling plate layer comprises:
        a second liquid inlet port coupled to the second cooling plate layer to receive a second cooling liquid into the phase change area; and
        a vapor outlet port coupled to the second cooling plate layer to expel the second cooling liquid in a vapor state from the phase change area, wherein a first portion of the first cooling plate layer is in thermal contact with a portion of the second cooling plate layer, and a second portion of the first cooling plate layer is in thermal contact with IT components to be cooled.

2. The cooling plate module of claim 1, wherein the first cooling plate layer further comprises: a first plurality of liquid cooling fins to form a first liquid channel in the single phase area.

3. The cooling plate module of claim 2, wherein the second cooling plate layer further comprises: a second plurality of liquid cooling fins to form a first liquid channel in the phase change area.

4. The cooling plate module of claim 3, wherein each of the first plurality of liquid cooling fins are spaced apart by a first spacing and each of the second plurality of liquid cooling fins are spaced apart by a second spacing.

5. The cooling plate module of claim 3, wherein the first plurality of liquid cooling fins is parallel to, and are staggered from, the second plurality of liquid cooling fins forming staggered liquid channels.

6. The cooling plate module of claim 3, wherein the first plurality of liquid cooling fins is perpendicular to the second plurality of liquid cooling fins forming perpendicular liquid channels.

7. The cooling plate module of claim 1, wherein the first cooling plate is coupled to a liquid manifold and the liquid manifold actively facilitates liquid flow in the single phase area.

8. The cooling plate module of claim 1, wherein a flow in the phase change area is facilitated by gravity as liquid flowing in the phase change area undergoes a phase change to a vapor state when a temperature of the second cooling plate layer is above a predetermined temperature, wherein vapor exits from the vapor outlet port and liquid enters the second inlet port of the phase change area.

9. The cooling plate module of claim 1, wherein a flow in the phase change area is facilitated by pressure as liquid flowing in the phase change area undergoes a phase change to a vapor state and a change in volume in the phase change area causes vapor to expel from the vapor outlet port, wherein the expelled vapor causes liquid at a liquid supply reservoir to enter the second inlet port of the phase change area.

10. The cooling plate module of claim 1, wherein the first cooling plate layer and the second cooling plate layer are independently machined with the single phase area separated from the phase change area.

11. The cooling plate module of claim 1, wherein the first cooling plate layer and the second cooling plate layer, together, is an integrated cooling plate which is machined as a single unit, wherein the integrated cooling plate includes a first plurality of liquid cooling fins on a first surface of the integrated cooling plate, wherein the integrated cooling plate includes a second plurality of liquid cooling fins on an opposing surface of the integrated cooling plate.

12. The cooling plate module of claim 11, wherein the integrated cooling plate further comprises a top frame covering the first plurality of liquid cooling fins, and a bottom frame covering the second plurality of liquid cooling fins, wherein the bottom frame is thermally coupled to the IT components to be cooled.

13. A cooling system comprising:
a first liquid supply and a liquid return;
a second liquid supply and a vapor return; and
at least one cooling plate module coupled to the first liquid supply and the liquid return, and the second liquid supply and the vapor return, wherein the at least one cooling plate module comprises:
a first cooling plate layer having a single phase area within, wherein the first cooling plate layer comprises:
a first liquid inlet port coupled to the first cooling plate layer to receive a first cooling liquid into the single phase area; and
a first liquid outlet port coupled to the first cooling plate layer to expel the first cooling liquid from the single phase area; and
a second cooling plate layer having a phase change area within, wherein the second cooling plate layer comprises:
a second liquid inlet port coupled to the second cooling plate layer to receive a second cooling liquid into the phase change area; and
a vapor outlet port coupled to the second cooling plate layer to expel the second cooling liquid in a vapor state from the phase change area, wherein a first portion of the first cooling plate layer is in thermal contact with a portion of the second cooling plate layer, and a second portion of the first cooling plate layer is in thermal contact with IT components to be cooled.

14. The cooling system of claim 13, wherein the first cooling plate layer further comprises: a first plurality of liquid cooling fins to form a first liquid channel in the single phase area.

15. The cooling system of claim 14, wherein the second cooling plate layer further comprises: a second plurality of liquid cooling fins to form a first liquid channel in the phase change area.

16. The cooling system of claim 15, wherein each of the first plurality of liquid cooling fins are spaced apart by a first spacing and each of the second plurality of liquid cooling fins are spaced apart by a second spacing.

17. The cooling system of claim 15, wherein the first plurality of liquid cooling fins is parallel to, and are staggered from, the second plurality of liquid cooling fins forming staggered liquid channels.

18. The cooling system of claim 15, wherein the first plurality of liquid cooling fins is perpendicular to the second plurality of liquid cooling fins forming perpendicular liquid channels.

19. A cooling plate module comprising:
an intermediate cooling plate;
a bottom frame secured to a bottom surface of the intermediate cooling plate having a single phase area in between the intermediate cooling plate and the bottom frame;
a top frame secured to a top surface of the intermediate cooling plate having a phase change area in between the intermediate cooling plate and the top frame;
a first liquid inlet port and a first liquid outlet port coupled to the intermediate cooling plate to form a first liquid channel in the single phase area; and
a second liquid inlet port and a vapor outlet port coupled to the intermediate cooling plate to form a second liquid channel in the phase change area, wherein a portion of the bottom frame is in thermal contact with IT components to be cooled.

20. The cooling plate module of claim 19, wherein the intermediate cooling plate includes a first plurality of fins on the bottom surface of the intermediate cooling plate and a second plurality of fins on the top surface of the intermediate cooling plate.

* * * * *